United States Patent [19]

Traut

[11] Patent Number: 4,518,737
[45] Date of Patent: May 21, 1985

[54] DIELECTRIC MATERIAL AND METHOD OF MAKING THE DIELECTRIC MATERIAL

[75] Inventor: G. Robert Traut, South Killingly, Conn.

[73] Assignee: Rogers Corporation, Rogers, Conn.

[21] Appl. No.: 349,466

[22] Filed: Feb. 17, 1982

Related U.S. Application Data

[63] Continuation of Ser. No. 213,837, Dec. 8, 1980, abandoned, which is a continuation-in-part of Ser. No. 972,995, Dec. 26, 1978.

[51] Int. Cl.³ .............................................. C08K 3/10
[52] U.S. Cl. .................................... 524/413; 524/444; 524/435; 524/493; 524/494; 252/518; 252/519; 252/520; 264/122
[58] Field of Search ............... 524/413, 444, 435, 493, 524/494; 252/518, 519, 520; 264/122

[56] References Cited

U.S. PATENT DOCUMENTS 4,031,041  6/1977  Bouy ..................................... 204/296
4,163,742  8/1979  Mansure ............................ 260/42.17
4,212,914  7/1980  Ponomarev et al. ................ 428/268

Primary Examiner—Melvin I. Marquis
Attorney, Agent, or Firm—Fishman & Dionne

[57] ABSTRACT

A method of making a dielectric material comprising blending in a polymer dispersion, a particulate filler material having a high dielectric constant and microfibrous material to form a slurry of polymer, filler, and fiber. A flocculant is added to the slurry to agglomerate the polymer particles, the filler particles, and the microfibers to produce a dough-like material. The dough-like material is formed into a desired shape and then subjected to heat and pressure to densify the dielectric material.

8 Claims, No Drawings

DIELECTRIC MATERIAL AND METHOD OF MAKING THE DIELECTRIC MATERIAL

CROSS-REFERENCE TO RELATED APPLICATION

This is a continuation, of application Ser. No. 213,837, filed Dec. 8, 1980, now abandoned, which is a continuation-in-part of application Ser. No. 972,995 filed Dec. 26, 1978.

BACKGROUND OF THE INVENTION (1) Field of the Invention

The present invention relates to dielectric materials and a method by which such dielectric materials are made.

(2) Description of the Prior Art

Dielectric materials may be used in many applications. Although not limited thereto in its use, dielectric materials have utility in microwave circuit boards. Also, dielectric materials may be used in capacitors.

One type of dielectric material was disclosed in a paper presented at IEEE/NEMA 1975 Electrical Electronics Insulation Conference at Boston, Mass. on Nov. 11, 1975, "EPSILAM 10- A New High Dielectric Constant Conformable Copper-Clad Laminate," M. Olyphant, Jr., D. D. Demeny, and T. E. Nowicki. EPSILAM 10, a product of the 3M Company, is believed to be a composite of poly(tetrafluoroethylene) (PTFE) and dielectric filler, the composite typically having a dielectric constant between 10 and 11 and being clad on both sides by copper foil.

Prior art dielectric materials exhibit numerous disadvantageous properties. Prior art dielectric materials, in general, absorb moisture in undesirable amounts. The absorption of moisture results in at least two serious problems: the electrical properties of the dielectric material are changed and the material may physically expand.

Moreover, prior art microwave dielectric materials may tend to have a non-uniform dielectric constant throughout the material. It is believed that this non-uniformity of dielectric constant is due, at least in part, to incomplete mixing of the dielectric material with the binder.

Futhermore, prior art dielectric materials may tend to have a relatively high energy dissipation factor.

Another type dielectric material used in microwave circuit boards is produced by Rogers Corporation, Rogers, Connecticut, and marketed under the trademark "RT/duroid". The "RT/duroid" dielectric material, which comprises PTFE and glass microfibers, has desirable strain relief properties but does not have a sufficiently high dielectric constant for some applications.

It is an object of the present invention to provide a dielectric material having a relatively high dielectric constant which is uniform throughout the material, relatively high tensile strength, desirable strain relief characteristics, low moisture absorption and an acceptable dissipation factor.

SUMMARY OF THE INVENTION

The present invention provides a dielectric material which has desirable strain relief properties, which has a relatively high and uniform dielectric constant and which has a relatively low dissipation factor at high frequencies. The dielectric material comprises a composite of a polymeric binder, a filler having a high dielectric constant and a microfibrous material. The dielectric material is produced by blending the particulate filler material having a high dielectric constant and a microfibrous material in a polymer dispersion to form a slurry of polymer, filler and fiber. The solids in the slurry are agglomerated to form a dough-like material. The dough-like material is formed into any desired shape which is then subjected to heat and pressure. This heating and pressuring is necessary to assure the melting of the polymer and the wetting of the filler and the fiber by the polymer.

In the preferred embodiment of the invention, the polymer dispersion comprises a dispersion of polytetrafluoroethylene, the filler material comprises titanium dioxide in a particulate form and the microfibrous material comprises glass microfibers. The slurry of polymer, filler and fiber is blended to provide for complete mixing of the polymer, filler and fiber and for a uniform distribution of these materials throughout the dispersion. The solid materials in the dispersion are agglomerated by a flocculant to produce a dough-like material. The dough-like material is separated from the liquid in the dispersion and dried and may be mixed with a suitable lubricant to provide an agglomerate having better processing properties. The agglomerate is then formed into any desired shape and subjected to heat and pressure.

In accordance with the present invention the fibers account for between 7% and 20% by weight of the non-filler content of the dielectric material and preferably between 8.5% and 14% by weight of the non-filler.

DETAILED DESCRIPTION OF THE INVENTION

In the process of making the dielectric material, a dispersion of polymer particles is selected, the polymer being dispersed by ionic or non-ionic surfactants. It is desirable that the polymer have a melting point higher than about 300° C. so that a circuit board made from the polymer is capable of withstanding high environmental and processing temperatures. The polymer may be selected from the following classes: halogenated hydrocarbons such as polytetrafluoroethylene (PTFE) and fluorinated poly(ethene-co-propene), polyolefins, polyacrylates, and substituted vinyl polymers such as polystyrene and poly(vinylidene fluoride).

The polymer dispersion is preferably an aqueous dispersion which is diluted to between about 10 and 35 weight percent solids, most preferably about twenty weight percent solids.

A dielectric filler is added to the polymer dispersion and mixed so as to uniformly distribute the filler in the dispersion. The filler can comprise from about 10 weight percent to about 75 weight percent of the dielectric material. For a dielectric constant of 10.5 using nonpigmentary titania filler, the filler should comprise between about 60 and 65 weight percent of the dielectric material. The filler and the amount of the filler in the dielectric material is selected depending upon the desired electrical properties of the dielectric material. Although it should be understood that the dielectric filler can be selected from any of a number of known dielectric materials, exemplary materials include titania, alumina, zirconia, ground quartz, amorphous or crystalline silica and ferrite ceramics in powder form. The upper limitation of the weight percent of the filler in the dielectric material is the amount at which the dielectric material would exhibit undesirable porosity or impaired strength. The filler material should be used in particle form and the average particle size should be below about 50 micrometers, and, most preferably, between about 1 and 20 micrometers in diameter. The preferred filler material is titania and particularly 3030 grade titanium dioxide. It should also be understood that a mixture of different filler materials may be used. For example, it may be desirable to use a titania filler and modify the magnetic permeability of the resulting material by including ferrite fillers. The filler added may be a mixture of filler and liquid, thereby simplifying handling of the filler and providing intimate mixture of the filler with the polymer dispersion.

Microfibers are then added to the polymer and filler slurry and are mixed in the slurry to provide a slurry of polymer, filler, and microfibers. Although it is preferred that the fiber comprise microfibrous glass, the fiber could be made from other compositions such as fibrous aluminum silicate or fibrous micro-crystalline materials such as a potassium titanate whisker material. Examples of other non-conductive microfibers include quartz fiber and zirconia fibers.

It is preferred that the fibers have an average diameter below about 2 micrometers and preferably have an average diameter of between about 0.1 and 1.0 micrometers. It is preferred that the fibers have, on the average, a relatively short length, preferably below about 3 millimeters. Since many of the fibers provided from conventional sources exceed this desired length, the fibers may be broken by any conventional mechanical means such as grinding the fibers or pressing the fibers to crush the fibers. The amount of microfibrous material included in the dielectric material should range between an amount greater than 7 and less than 20 weight percent of the total non-filler content of the dielectric with the preferred range being between 8.5 and 14 weight percent. Particularly good success has been achieved employing a fiber sold by Johns Manville Co. under the designation 104E and believed to comprise a low sodium and potassium content borosilicate glass. The fibers may be added in dry form or may be added in a liquid-fiber slurry to facilitate handling.

It should be understood that the polymer, the filler material and the fibers may be mixed in any order. However, it is desirable to mix the aforementioned materials in such a manner as to provide uniform distribution of the materials. This is necessary in order to provide a dielectric material having a relatively uniform dielectric constant, uniform strain relief and uniform moisture resistance. Although it is envisioned that other liquids may be used in the slurry, it is particularly preferred that the aforementioned slurry have an aqueous base. Once the slurry is mixed in any conventional manner to a point wherein the fibers, the particles of filler material, and the polymer are intimately and uniformly mixed, the materials in the slurry are agglomerated to provide a dough-like mass.

In order to agglomerate the mixture of polymer, filler and fibers, a flocculant is added to the mixture. It should be understood that the chemical composition of the flocculant used is dependent upon the polymer chosen and the manner by which the polymer is dispersed.

The preferred flocculating agent for formulations based on PTFE is poly(ethyleneimine), (PEI), a commercially available water soluble polymer having the repeating unit:

and available as an aqueous solution. It is understood that aqueous solutions combine with $H_2O$ to form a polycationic material with the repeating unit:

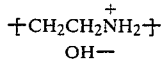

A large number of other polycationic flocculating agents could also be used. It is believed that these materials flocculate the mixture by attaching to anionic groups on the surfaces of the polymer particles, the fibers, and the fillers. Another type of flocculant that would be effective with ionically stabilized polymer dispersions is the hydrolyzable inorganic compounds that form aqueous solutions of polyvalent ions. These function by reducing the ionic double layer repulsion between polymer particles.

The liquid is removed from the agglomerated material by any conventional technique. A preferred method of removing the liquid from the agglomerated material is to transfer the agglomerated material to a nylon fabric filter bag and allow gravity drainage of the material. By this method there is produced a batch of wet crumbly dough having about 60 weight percent solids. The batch may be then spread thinly in shallow trays and allowed to dry in an oven at a temperature of 100° to 200° C. for 16 to 24 hours or at any temperature and time sufficient to remove the remaining liquid from the agglomerated material.

The agglomerate or dough comprising the polymer, filler, and microfibers are formed into any desired shape. This shape is then further processed by the application of heat and pressure which causes densification of the shape and causes the polymer to wet the filler and fibre. The applied temperature and pressure preferably should respectively range between 600° F. and 800° F. and 100 p.s.i. and 900 p.s.i., with the preferred temperature being 760° F. and the preferred pressure being approximately 700 p.s.i.

In the case of an aqueous slurry, it should be understood that the forming or shaping of the agglomerate into sheets or other desired shapes is difficult because the agglomerate tends to be sticky and clog extrusion dyes or stick to calendering apparatus. In cases where it is difficult to form the desired shapes from the aqueous agglomerate, it is preferred that the agglomerate be dried and then mixed with a suitable lubricant, the lubricant allowing for shaping of the agglomerate by any conventional means such as calendering or paste extrusion.

The lubricant can be selected from various conventional lubricants. It is particularly preferred that the lubricant be non-toxic as a liquid or a vapor and have a relatively low volatility so that, at forming temperatures, the liquid lubricant will not vaporize. However, it should be understood that for particular forming method, it may be necessary to use a toxic lubricant which may also have a relatively high volatility. The particularly preferred lubricant is dipropylene glycol (DPG) manufactured by Union Carbide Corporation. Other types of lubricants include Stoddard solvent, a mixture of aliphatic hydrocarbons commercially available as a dry cleaning fluid, a liquid polyisobutylene sold by Exxon under the "Vistanex" trademark and esters such as dioctylphthalate.

In the preferred embodiment of the invention, the polymer dispersion is an aqueous dispersion of PTFE particles stablized by an added nonionic surface active agent. The filler material is a ceramic grade titanium dioxide and the fibers are borosilicate glass fibers, all of which are believed to have a negative charge.

A flocculating agent is added to the mixture to agglomerate the filler, the PTFE particles and the fibers. The water is removed from the agglomerate to provide a dried crumb dough.

The lubricant is mixed with the dried crumb dough so as to uniformly disperse the lubricant and to break up the large aggregates of the dough. The mixture of the lubricant and the dough provides a material which is still dry in appearance and in a crumb or fibrous particle form. The material is then formed into any desired shape by conventional methods, such as, for example, paste extrusion and/or calendering. After the dough is formed into the desired shape, the formed shape, whether a sheet or some other shape, is dried in a vented forced air circulation oven for example for 16 to 24 hours at 200° to 300° C. This dried shape is then subjected to heat and pressure The finished shape may then be cut or trimmed to desired dimensions. The preferred shape is a sheet having one or both opposing surfaces coated with a conductive layer forming a microwave circuit board. This conductive layer is customarily applied during the pressurized heating step by placing a thin sheet of adhesive coated conductive foil in contact with the sheet of dielectric material before the application of heat and pressure. The end product is a laminate of conductive foil and dielectric material.

The dielectric materials provided by the process of the present invention have various properties that make such dielectric materials particularly useful.

One important aspect of the present invention is the provision of a dielectric material which provides both for reduced strain relief in microwave circuit boards incorporating the dielectric material and for nearly equal dimensional change in both the X and Y directions as a result of strain relief. Strain relief is a measurement of the dimensional changes of the microwave circuit board in both the X and Y directions after a portion of the conductive foil has been removed by an etchant or a solvent. As will be understood by those skilled in the art, it is essential to reduce the dimensional changes of the circuit board because of the requisite high tolerances which must be maintained if these circuit boards are to be used at microwave frequencies.

Strain relief is measured by determining the dimensional of a strip specimen due to removal of the conductive foil. Sometimes the change in dimension is retarded by viscoelastic behavior of the composite. It has been found that a brief heat exposure after foil removal accelerates the change in dimension.

In the case of PTFE, titania and microfiber glass composites described as the preferred embodiment of this invention, as well as other microwave circuit board materials based on PTFE, the following procedure for measuring strain relief is believed to be satisfactory:
1. A 25 millimeter strip of the material is cut, taking care to avoid flexing or other mishandling that would impose strains on the specimen.
2. Use a sharp stylus to mark two points on the metal foil, about 300 mm apart, on the same side of the specimen.
3. Condition the specimens for 24 hours in standard laboratory conditions, 23° C., 50% R.H.
4. Measure in the same atmosphere the distance between centers of the marks using an optical method capable of 5 micrometer resolution.
5. Mask an area encompassing each mark about 12 millimeters square using a pressure sensitive tape capable of withstanding etching conditions.
6. Chemically etch away the metal foil, except for the masked areas. This can be done with various etchants known to those versed in the art, such as solutions of ferric chloride or ammonium persulphate. Rinse the etched specimen in clean water.
7. Remove the masks.
8. Bake the specimen for one hour at 150° C. followed by conditioning as in step 3.
9. Measure the distance between centers of the marks.
10. Calculate dimension change as mm change per meter of original length between marks.

Another particularly important property of the dielectric materials of the present invention is their high degree of moisture-resistance. Moisture resistance is measured by weighing specimens of the dielectric material from which the metal foil has been removed by etching followed by washing and drying for 1 hour at 150° C. The weighing is done before and after a water immersion test and the amount of water absorbed is determined. Water immersion is for 48 hours at 50° C. It has been found that with the preferred embodiment of this invention, it is possible to fabricate circuit boards that absorb less than about 0.5 weight percent water when subjected to the afore-mentioned test.

A further important property of the dielectric material provided by the method of the present invention is that it has a relatively high dielectric constant and the dielectric constant is quite uniform throughout the entire material. It has been found that with the described method, it is possible to provide a dielectric material having a dielectric constant in the range of about 10 to about 11 and having a uniformity of ±0.25.

The dielectric constant of the material is determined by measuring the dielectric constant of a circuit board incorporating the material. The dielectric constant is measured at microwave frequencies by employing adaptations of one of the test methods described in American Society of Testing and Materials Standard Methods D-3380 or D2520. Employing the aforementioned methods as background information it has been found that an effective method involves etching two resonator elements of differing lengths with their appropriate probe lines onto a given specimen. The etched specimen and a matching specimen etched free of foil are clamped between conductive plates to form an assembly containing two stripline resonators. The resonant frequencies in the 8 to 12.5 GHz range and the lengths of these resonators are determined at a clamping stress of 6.9 MPa. From these data one may then calculate the fringing correction for the resonator length and the dielectric constant The calculation is based on the known fact that the propagation velocity of a transverse electrical mode electromagnetic wave through a dielectric medium having a magnetic permability of unity is related directly to the square root of the inverse of the dielectric constant.

Another important property of the dielectric materials of the method of the present invention is that a circuit board incorporating these materials has a relatively low energy dissipation factor at high frequencies. At 10 GHz, the circuit board usually has a dissipation factor of less than about 0.005. The dissipation factor is measured as follows:

The half power width of the resonant frequency peak in the stripline resonator utilized in the dielectric constant measuring method described above is divided by the resonant frequency to give a dissipation ratio for both metal and dielectric. An estimated value for the metal is calculated and subtracted from the ratio to give dissipation factor of the dielectric material.

The following examples and tables demonstrate various physical properties for the preferred laminate of conductive foil and dielectric layer:

EXAMPLE 1.

The ingredients were slurried as follows: 45 liters of tap water were placed in a 20-gallon tank and mixed with 148 grams of microfiber (Johns Manville's 104E glass fiber pre-crushed by rolling). The water and microfibers were mixed for about ten minutes. The filler containing 2520 grams of solids, a titania (titanium dioxide) filler sold by National Lead Industries under the trademark "Titanox 3030" was added and mixed with the microfiber and water mixture for five minutes. A polymer dispersion of PTFE, believed prepared by emulsion polymerization of TFE in the presence of a perfluoroalkane carboxy salt emulsifying agent and stabilized after polymerization by the addition of about 0.7% nonionic surface active agent poly(ethyleneoxy) nonyl phenol, sold by ICI under the trademark "Fluon AD-704", in the amount of 3132 grams solids was added and was mixed for about 10 minutes. The level of water was brought up to 50 liters with additional water. The slurry was mixed for five minutes and then a flocculant was added. The flocculant used in this example was poly(ethyleneimine), (PEI), in a one-weight percent solution. Eighty grams of this 1% solution was added to the slurry and the slurry was mixed for about ½ minute. Additional flocculant solution was added in small increments until the flocculation resulted in clear water between the flocs. The total amount of flocculant solution added was about 120 grams.

The flocculated solids suspended in water were transferred to a nylon fabric filter bag to allow gravity drainage of the water, thereby providing a wet, crumbly dough having approximately 68% solids. The crumb was then spread in a one-inch thick layer in shallow trays and dried for 24 hours at 160° C. in a forced air circulation oven. The dried crumb was in the form of small chunks. Thereafter, the dried crumb was mixed with a lubricant. The lubricant used was dipropylene glycol (DPG) sold by Union Carbide Corporation. DPG is non-toxic as a liquid or as a vapor and has a relatively low volatility at room temperature. A blender was used to mix the aggregates of dried crumb and uniformly disperse the lubricant. For 3,900 grams of crumb, 688 grams of lubricant was added.

The lubricated dough was then formed into sheets. First, the lubricated dough was formed into a billet having dimensions 38 mm diameter by about 40 mm height. The billets were then extrusion-pressed at about 12,000 psi at a speed of about 3.0 inches per minute through a 4.8 mm diameter die to produce a rope-like extrudate of about 5 mm diameter. This extrudate was then passed through a 2 roll calender with a 0.25 mm gap setting to produce a ribbon. The X direction is considered parallel to the extrusion and the Y direction perpendicular to the X direction in the plane of the ribbon. These co-ordinates are discussed in connection with the finished clad panels.

Several layers of ribbon were combined in two calendering operations in the X direction and the spacing between the rollers of the calender was 0.045 inches and 0.035 inches respectively. The calender roll force against gap determining stops was set at 90 psig on the 2 eight-inch diameter cylinders of the calender. Sheets 12.8 inches long were cut from the extruded ribbon and were extended by repeated calendering passes in the Y direction, to form sheets about 12 inches wide and at least 20 inches long.

The sheets were laid in a stack on clean, aluminum trays and dried in a vented forced air circulation oven for 24 hours at 246° C. whereafter the sheets were trimmed accurately to an 11 by 18 inch sheet.

The sheets were clad with copper foil rolled to a thickness of about 34 micrometers and surface treated for adhesion on one side. The foil was cut to sheet size of 18.5 by 11.5 inches.

The composite sheets were stacked to attain the desired thickness and assembled between copper foil and stainless steel caul plates to form a layup or laminating package that was then wrapped in an aluminum foil envelope folded and rolled at the edges to exclude air. The package was clamped between cold platens in a laminating press at about 3.4 MPa. This pressure was maintained through a heating and cooling procedure that caused the composite to undergo crystalline melt and limited flow to accomplish densification and adhesion of the sheets to adjacent sheets or adjacent foil in the layup. The heating was done by electrical heating elements in the platens controlled thermostatically to maintain a package temperature of 396° C. for 45 minutes. At the end of this period the heating circuits were turned off and the platens and package allowed to cool over an additional 3 to 4 hour period to a temperature below 150° C. at which point the press was opened and the laminated panels were removed from between the platens.

The microwave circuit boards were tested for the various properties indicated in Table 1. Table 1 shows a vast improvement over the prior art with strain relief properties which are nevertheless less than optimum.

EXAMPLE 2

A lubricated dough compound was prepared by exactly the same method as in Example 1 except that a slight change was made in the proportion of polymer, fiber, and filler so that they were present in 33.5, 3.7, and 62.8 parts by weight respectively.

The lubricated dough was then molded into bricks having dimensions of 50 mm by 150 mm by 50 mm height. These were then press extruded through a slit die having a slit opening of about 2.5 mm by 150 mm to produce a ribbon shaped extension which was then calendered one pass in the X direction and cut into 318 mm lengths which were then calendered in the Y direction to produce sheets of about 500 mm length Y direction by about 300 mm in the X direction.

The sheets were then dried and laminated into panels the same as Example 1 except that the clamping stress used in the press was about 5.2 MPa; the temperature was about 388° C. and the time at temperature was about 225 minutes.

Data on typical panels prepared by this example are shown in Table II and here again the strain relief properties, which significantly improved when compared to the prior art, are still less than optimum.

EXAMPLE 3

A series of formulations were processed to the condition of a wet dough by a procedure similar to that of Example 1 except for slight changes in the relative proportions of polymer, filler and fiber as shown in Table III.

Instead of drying the wet dough before processing it into sheets these forumlations were formed into sheets by evenly spreading the wet crumb onto a carrier sheet of polyester plastic film and passing this through the nip of a two roll calender several times to form a self supporting cohesive sheet which was then peeled from the plastic film and subjected to further calender passes until a suitable sheet of desired thickness and size was obtained. This more difficult procedure was necessary because it was found too difficult to extrude the wet dough into a rope or ribbon.

The formed sheets were then dried for sixteen hours at 105° to 204° C. in a forced air circulator oven. The dried sheets were assembled with 34 μm thick copper foil and stainless steel caul plates into laminating packages.

Laminating was accomplished by the following steps:
1. The package was precompressed by subjecting it to a stress of 6.9 MPa for 1 minute in a press with platens at about 2320 C.
b 2. The package was heated and sheets and foil were bonded together by clamping the package at 1.7 MPa in a press with platens already heated to 388° C. The package was held in this condition for a period of 50 minutes.
3. The package was densified and cooled by rapidly transferring it to a press with platens at about 23° C. where it was clamped at 3.4 MPa until the package temperature was below 150° C.

Table III summarizes the formulations and test results of eight panels prepared from four formulations in accordance with Example 3.

TABLE I
PANELS CLAD WITH 34 μm COPPER FOIL

|  | Panel identification | |
|---|---|---|
|  | 1A | 1B |
| Thickness, average of 20 values mm | .618 | .612 |
| Uniformity (std. dev. as % of avg.) | 2.45 | 2.57 |
| Specific gravity (by immersion of dielectric only) | 2.830 | 2.806 |
| Peel strength of foil bond after 20 seconds float in solder at 260° C. (average minimum value per 3 mm strip, kN/m) | 1.17 | 1.12 |

TABLE I-continued
PANELS CLAD WITH 34 μm COPPER FOIL

|  | Panel identification | |
|---|---|---|
|  | 1A | 1B |
| Strain relief after etching away foil mm/m | | |
| X direction | −1.89 | −2.13 |
| Y direction | −.53 | −.69 |
| Dielectric constant at X band | | |
| Resonator in X direction | 10.26 | 10.22 |
| Resonator in Y direction | 10.15 | 10.03 |
| Q of resonator at X band | | |
| "As is" condition of dielectric | 204 | 192 |
| Dielectric soaked 48 hours in 50° C. water | 172 | 154 |
| Water absorption, % weight gain of dielectric specimen after 48 hours in 50° C. water | 0.25 | 0.23 |

TABLE II

|  | Panel Identification | | |
|---|---|---|---|
|  | 2A | 2B | 2C |
| Strain relief mm/m | | | |
| X direction | −1.10 | −.97 | −1.05 |
| Y direction −1.27 | −1.05 | −1.25 | . |
| Peel strength, kN/m | | | |
| after 20 sec. float in 260° C. solder | 9.4 | 8.2 | 6.8 |
| std. deviation of 4 readings | .6 | .3 | .0 |
| Dielectric constant at 10 GHz | 10.43 | 10.60 | 10.58 |
| Q of resonator | 313 | 283 | 304 |

TABLE III

|  | Panel Identification | | | | | | | |
|---|---|---|---|---|---|---|---|---|
|  | 3A | 3B | 3C | 3D | 3E | 3F | 3G | 3H |
| Composition in parts by weight | | | | | | | | |
| Polymer | 33.6 | 33.6 | 33.6 | 33.6 | 31.6 | 31.6 | 31.6 | 31.6 |
| Filler | 63 | 63 | 63 | 63 | 65 | 65 | 65 | 65 |
| Fiber | 3.4 | 3.4 | 3.4 | 3.4 | 3.4 | 3.4 | 3.4 | 3.4 |
| Fiber crush method | press | press | roll | roll | press | press | roll | roll |
| Test results of laminated panels | | | | | | | | |
| 1. Avg. Thickness, mm | .74 | .72 | .68 | .69 | .71 | .71 | .73 | .72 |
| 2. Thickness uniformity (std. dev. as % of avg.) | 2.11 | 1.31 | 1.42 | 3.04 | 1.27 | 1.14 | 1.10 | 1.59 |
| 3. Specific gravity by immersion | 2.904 | 2.936 | 2.936 | 2.905 | 2.966 | 2.941 | 2.900 | 2.945 |
| 4. Dielectric constant at X band | 10.07 | 10.16 | 9.62 | 9.58 | 10.88 | 10.84 | 9.00 | 9.80 |
| 5. Q of resonator at X band | 189 | 183 | 176 | 173 | 178 | 165 | 190 | 176 |

As the above demonstrates the absorption of water is minimized despite the fact that fibers are added to the composition. This is an unexpected result since it was previously believed that increasing the fiber content would increase the porosity of the final product drastically. One suggested theory for this result is that the fiber disrupts the flow of the formed shape during the heat and pressure application step. This would allow the application of greater pressures at higher temperatures and thus form a denser end product. It should be noted that the above theory is only suggestive and should not be taken to limit the present invention.

Another unexpected result is that the dielectric constant in the end product is isotropic. This isotropic state was unanticipated since it was expected that the fibers would orientate, under the applied pressure, and inhibit an even distribution of the dielectric filler material.

The enhanced strain relief properties combined with the unexpected improvement in the dielectric distribution and the minimized water absorption result in the dielectric material of the present invention comprising a significant improvement when compared to prior art dielectric materials intended for similar applications.

It has been determined that a dielectric material in accordance with the present invention should have a strain relief which closely approaches 1 mm/m in both the X and Y directions, and which preferably is less than 1 mm/m in both the X and Y directions, and a water absorption of less than 0.5%. By extrapolation of the test results set forth in Table IV, this fiber content lies between a percentage by weight of fibers to total non-filler in the range of 7% to 20%. It may also be seen from Table IV that the initial addition of fiber, 0.15% by weight, increases the water absorption as expected. However, within the range of fiber addition lying between 0.15% and 5.00% by weight there is an unexpected diminishing in water absorption before the resumed expected increase. In the critical range of fiber content, accordingly, there is the unexpected result that the amount of water absorption does not increase in direct proportion to the amount of fiber present. It was expected that the moisture absorption would continue to increase at the rate defined by the values determined for fiber content of 0% and 0.15% with the maximum acceptable value of fiber content by weight thus lying below 1% where the strain relief properties are unacceptable. However, because of the unexpected dip in moisture absorption, it is possible to take advantage of the reduction in strain relief afforded by up to approximately 20% fiber in the total non-filler included in the dielectric. For the samples tested, the optimum range of fiber content was between 3% and 5% by weight or in a weight ratio of 0.07 to 0.20 of the total non-filler.

All of the samples in Table IV were prepared, to form a dielectric sheet material, by exactly the same method as in Example 2 except that the intermediate step of forming the dough into bricks prior to extrusion was not performed. Also, the initial removal of liquid from the agglomerated material was accomplished by draining over a screen. The binder was PTFE, the filler grade 3030 titanium dioxide and the microfibers were glass. Sheets of each sample composition were laminated between copper foils at 200 p.s.i., 400 p.s.i. and 707 p.s.i. at 760° F. These sheets were then subjected to the previously mentioned tests for water absorption, strain relief, determining the dissipation factor at 10 GHz and determining changes in both the dissipation factor and dielectric constant.

Although not shown in Table IV, the samples were also subjected to tensile strength tests to determine the modules in kpsi, and the ultimate stress, in psi. For use in microwave applications, a high resistance to deformation; i.e., stiffness; without being brittle and the modules of the material is a measure of this resistance to deformation. Similarly, the dielectric sheet material should show a high degree of resistance to damage during fabrication and use and the ultimate stress is a measure of this resistance to damage. It was known that the addition of ordinary fiber fillers to prior art polymer compounds would increase both the modules and ultimate stress up to a point with an excess of fibers beyond this point degrading the properties of interest. The maximum fiber content before a reduction in modules and/or ultimate stress has been encountered has historically been quite high. Most unexpectedly, it has been found that the maximum modules and ultimate stress for the dielectric material of the present invention occurs at a very low microfiber content. In fact, the maximum modules and ultimate stress for the samples of Table IV lie within the 7% to 20% fiber/non-filler range discussed above.

TABLE IV

| | Run number | | | | | | | |
|---|---|---|---|---|---|---|---|---|
| | 1 | 2 | 3 | 4 | 5 | 6 | 7 | 8 |
| Ceramic filler | 65 | 65 | 65 | 65 | 65 | 65 | 65 | 65 |
| Fiber | 0.00 | 0.15 | 0.30 | 0.63 | 1.30 | 2.50 | 5.00 | 10.00 |
| PTFE | 35.00 | 34.85 | 34.70 | 34.37 | 33.70 | 32.50 | 30.00 | 25.00 |
| % Fiber/Non-filler | 0 | 0.4 | 0.9 | 1.8 | 3.7 | 7.1 | 14.3 | 28.6 |
| A. Laminates made at 200 psi | | | | | | | | |
| Strain relief, mm/m | | | | | | | | |
| X | −1.63 | −1.70 | −1.54 | −1.10 | −1.35 | −0.82 | −0.76 | −0.61 |
| Y | −2.09 | −2.16 | −2.36 | −2.01 | −2.37 | −1.41 | −0.99 | −0.32 |
| DF at 10 GHz | 168 | 148 | 144 | 169 | 149 | 171 | 172 | 950 |
| Humidity, | | | | | | | | |
| % DF change | 51 | 205 | 107 | 40 | 39 | 43 | 58 | 48 |
| % DK change | 0.7 | 1.6 | 1.0 | 1.2 | 1.04 | 0.3 | 0.9 | 0.4 |
| Water absorption, % | 0.10 | 0.33 | 0.16 | 0.14 | 0.29 | 0.23 | 0.39 | 0.53 |
| B. Laminates made at 400 psi | | | | | | | | |
| Strain relief, mm/m | | | | | | | | |
| X | −1.40 | −1.83 | −1.58 | −1.27 | −1.19 | −0.74 | −0.63 | −0.67 |
| Y | −2.18 | −2.41 | −2.60 | −2.13 | −1.97 | −1.59 | −0.83 | −0.36 |
| DF at 10 GHz | 175 | 197 | 153 | 143 | 154 | 153 | 184 | 868 |
| Humidity, | | | | | | | | |
| % DF change | 286 | 208 | 67 | 64 | 55 | 10 | 24 | 41 |
| % DK change | 1.9 | 1.8 | 0.9 | 0.4 | 0.8 | 0.2 | 0.6 | 0.2 |
| Water absorption, % | 0.10 | 0.27 | 0.09 | 0.07 | 0.24 | 0.22 | 0.41 | 0.68 |
| C. Laminates made at 760 psi | | | | | | | | |
| Strain relief, mm/m | | | | | | | | |
| X | −2.52 | −2.04 | −1.79 | −1.48 | 1.47 | −0.92 | −0.62 | −0.43 |
| Y | −2.62 | −2.39 | −2.76 | −2.25 | 2.14 | −1.70 | −0.71 | −0.23 |
| DF at 10 GHz | 202 | 211 | 173 | 163 | 141 | 173 | 206 | 442 |
| Humidity, | | | | | | | | |
| % DF change | 8 | 679 | 75 | 84 | 120 | 89 | 72 | −20 |
| % DK change | 0.2 | 3.3 | 0.6 | 1.1 | 1.0 | 0.6 | 0.3 | 1.0 |
| Water absorption, % | 0.09 | 0.24 | 0.04 | 0.05 | 0.20 | 0.15 | 0.43 | 0.52 |

DF = dissipation factor (× 100,000)
DK = dielectric constant

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A non-porous dielectric sheet material wherein the dielectric constant is substantially isotropic, said sheet material comprising a fluorinated polymer binding selected from the group consisting of polytetrafluoroethylene, fluorinated poly (ethene-co-propene), polyolefins, polyacrylates, polystyrenes and poly (vinylidene fluoride), a ceramic filler in particulate form having an average particle diameter of between about 1 to 20 micrometers and non-conductive inorganic microfibers having an average diameter less than 2 micrometers selected from the group consisting of glass, aluminum silicate, potassium titanate, quartz and zirconia, the ratio of the weight of fibers to total non-filler being in the range of 0.07 to 0.20 and the filler comprising between 10% and 75% by weight of the dielectric material.

2. The dielectric material of claim 1 having a water absorption less than 0.5 percent.

3. The dielectric material of claim 1 wherein said ceramic filler is selected from the group comprising titania, aluminia, zirconia, ground quartz, amorphous or crystalline silica and ferrites.

4. The sheet material of claim 1 wherein said polymer binder comprises polytetrafluoroethylene and wherein said ceramic filler comprises titania, said titania comprising at least 60% by weight of the dielectric material and having an average particle size of between about 1 to 20 micrometers.

5. The material of claim 3 wherein said microfibers are glass and comprise more than 3.00% and less than 5.00% by weight of the dielectric material.

6. The material of claim 4 wherein said microfibers are glass and comprise more than 3.00% and less than 5.00% by weight of the dielectric material.

7. A method of making a non-porous isotropic dielectric sheet material which has desirable strain relief characteristics in the X and Y directions, a substantially isotropic dielectric constant and a water absorption less than 0.5% comprising the steps of:

mixing a dispersion of fluorinated polymer selected from the group consisting of polytetrafluoroethylene, flourinated poly (ethene-co-propene), polyolefins, polyacrylates, polystyrenes, and poly (vinylidene flouride) particles with a dielectric filler material in particulate form and nonconductive inorganic microfibers selected from the group consisting of glass, aluminum silicate, quartz, zirconia and potassium titanate to form a slurry, the slurry comprising enough filler and fibers to obtain in the final product between 10% and 75% by weight of the filler and between 7% and 20% fibers of the total non-filler content;

agglomerating the polymer particles, the ceramic filler particles and the microfibes to provide a mass of dielectric material;

shaping said mass; and subjecting the shaped mass to heat and pressure to densify the dielectric material.

8. The method of claim 7 wherein the step of mixing further comprises:

adding a ceramic filler having an average particle size of between about 1 to 20 micrometers and between 3% and 5% by weight of glass fibers to an aqueous dispersion of polytetrafluoroethylene.

* * * * *